United States Patent
Bellows et al.

(10) Patent No.: US 7,925,823 B2
(45) Date of Patent: Apr. 12, 2011

(54) REUSE OF FUNCTIONAL DATA BUFFERS FOR PATTERN BUFFERS IN XDR DRAM

(75) Inventors: Mark David Bellows, Rochester, MN (US); Kent Harold Haselhorst, Byron, MN (US); Paul Allen Ganfield, Rochester, MN (US); Tolga Ozguner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 11/875,469

(22) Filed: Oct. 19, 2007

(65) Prior Publication Data

US 2008/0040534 A1   Feb. 14, 2008

Related U.S. Application Data

(62) Division of application No. 10/992,378, filed on Nov. 18, 2004, now Pat. No. 7,380,052.

(51) Int. Cl.
*G06F 12/00* (2006.01)

(52) U.S. Cl. .................. 711/104; 711/E12.007

(58) Field of Classification Search .................. None
See application file for complete search history.

(56) References Cited

U.S. PATENT DOCUMENTS

| | | | |
|---|---|---|---|
| 6,587,804 B1 * | 7/2003 | Johnson et al. | 702/107 |
| 7,047,374 B2 | 5/2006 | Sah et al. | |
| 7,155,568 B2 | 12/2006 | Richard et al. | |
| 2006/0106975 A1 * | 5/2006 | Bellows et al. | 711/105 |

* cited by examiner

*Primary Examiner* — Reginald G Bragdon
*Assistant Examiner* — Aracelis Ruiz
(74) *Attorney, Agent, or Firm* — Francis Lammes; Stephen J. Walder, Jr.; Matthew B. Tatpis

(57) ABSTRACT

A mechanism is provided to reuse functional data buffers. With Extreme Data Rate (XDR™) Dynamic Random Access Memory (DRAM), test patterns are employed to dynamically calibrate data with the clock. To perform this task, data buffers are employed to store data and commands for the calibration patterns. However, there are different procedures and requirements for transmission and reception calibrations. Hence, to reduce the amount of hardware needed to perform transmission and reception calibrations, the data buffers employ additional front end circuitry to reuse the buffers for both tasks.

6 Claims, 6 Drawing Sheets

REUSE OF FUNCTIONAL DATA BUFFERS FOR PATTERN BUFFERS IN XDR DRAM

This application is a divisional of application Ser. No. 10/992,378, now U.S. Pat. No. 7,380,052, filed Nov. 18, 2004, status issued.

FIELD OF THE INVENTION

The present invention relates generally to data buffers, and more particularly, to reuse of functional data buffers in the memory interface unit for calibrating memory.

DESCRIPTION OF THE RELATED ART

In conventional Dynamic Random Access Memories (DRAMs), data synchronization can be difficult. However, with the introduction of Extreme Date Rate (XDR™) DRAM, which is available from Rambus, Inc., El Camino Real, Los Altos, Calif. 94022, on-chip alignment of data with the clock is possible. An XDR™ DRAM (XDRAM) employs a flexible architecture that allows automatic centering of the data and clock. Having such a dynamic phase alignment system reduces the need for precise Printed Circuit Board (PCB) timing constraints and PCB trace length matching when designing control hardware.

Part of the phase alignment architecture employs initialization hardware that incorporates calibrations. Referring to FIG. 1 of the drawings, the reference numeral 100 generally designates a flow chart depicting a conventional XDRAM calibration.

With such a calibration technique, pattern loads are required so that the dynamic phase alignment can occur by aligning the predetermined outcomes from the loaded patterns. The calibration process begins by calibrating current and impedances of the differential Input/Output (I/O) devices in step 102. The period of time in which the differential I/O devices are calibrated is referred to as the ICAL-ZCAL period. Once the differential I/O devices have been calibrated, the serial and pattern loads occur in step 104. The external XDRAMs are serially loaded and the memory controller is loaded with the pattern. Based on the loaded serial data and patterns loaded, calibration for the receive data (RX_CAL) occurs in step 106. Then, calibration for transmit data (TX_CAL) occurs in step 108.

However, XDRAMs, as with many other DRAMs and semiconductor devices, strive to conserve area with a high degree of flexability. Specifically, pattern buffer space for calibrations can occupy a great deal of silicon. Therefore, there is a need for a method and/or apparatus that makes XDRAM calibrations more efficient, requiring less area that addresses at least some of the problems associated with conventional XDRAM calibrations.

SUMMARY OF THE INVENTION

The present invention provides a method, an apparatus, and a computer program for effecting calibration of Random Access Memories (RAMs) with data patterns and commands. At least one store queue to provide the data and the commands is established. Then, the queues are revalidated to permit storing of flexible addresses and data into a pattern buffer whereby the flexible addresses and data are reusable for differing iterations and phases of the calibration.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
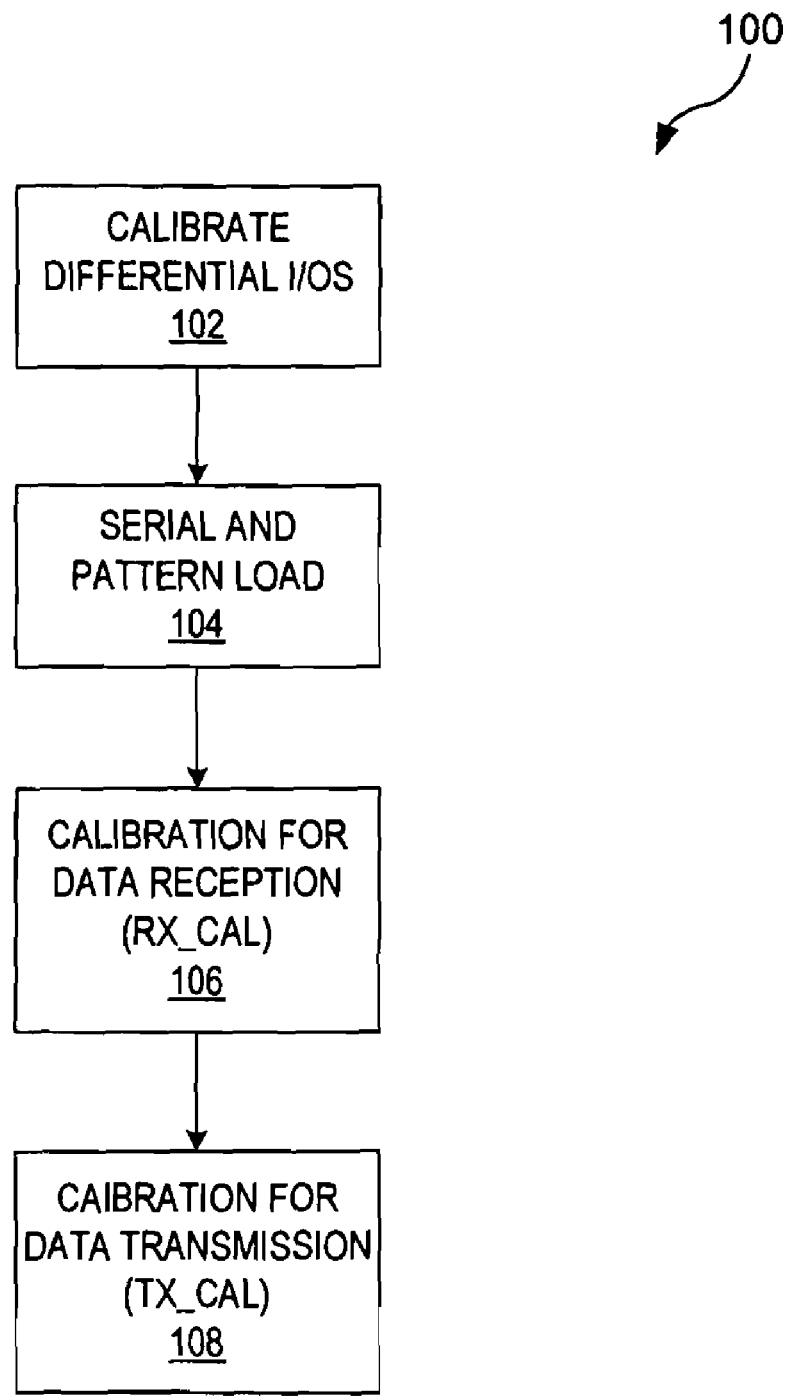
FIG. 1 is a flow chart depicting a conventional XDRAM calibration.
Figure 2A:
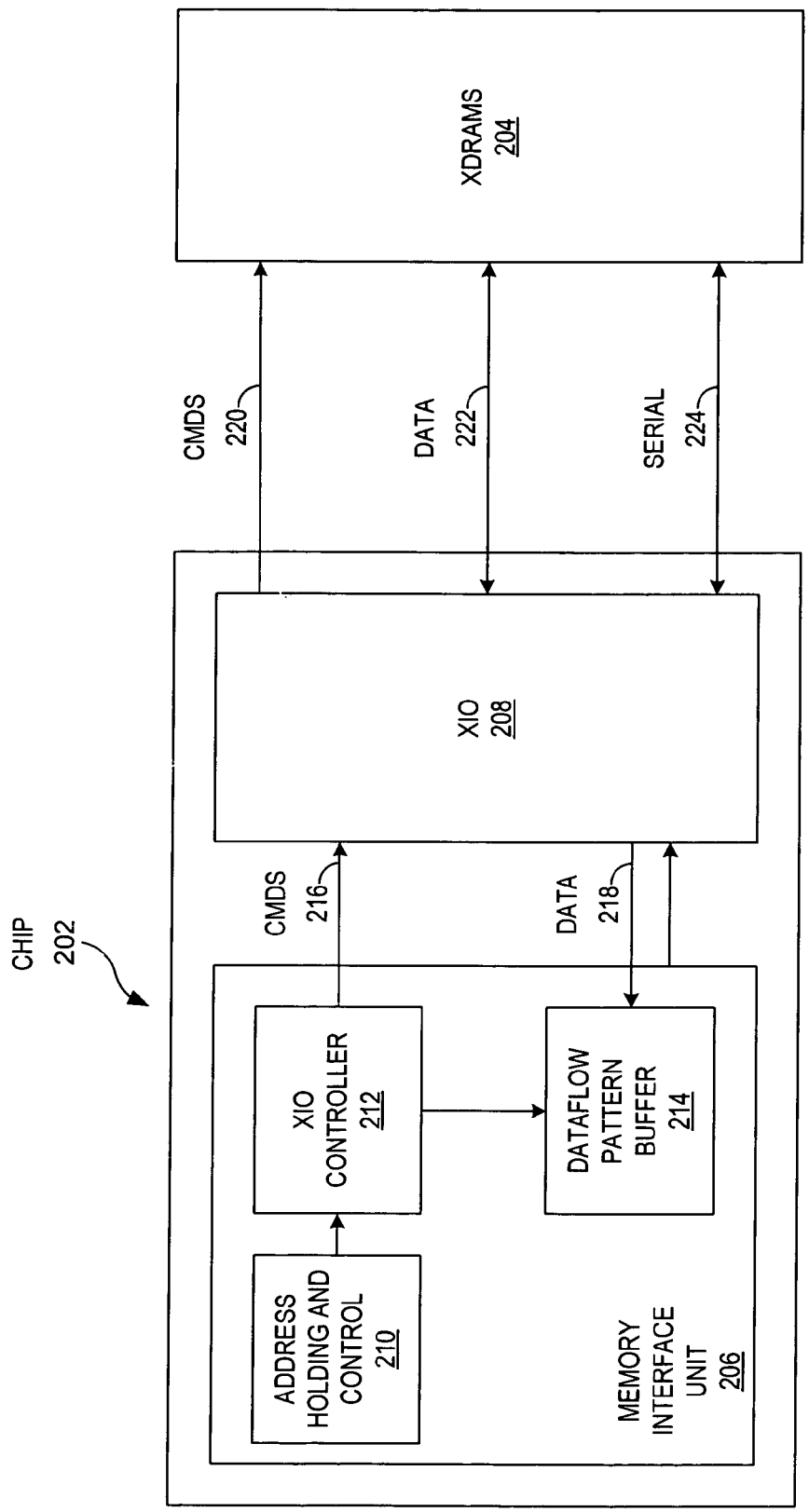
FIG. 2A is a block diagram depicting a modified XDRAM memory unit.

Referring to FIG. 2A of the drawings, the reference numeral 200 generally designates a modified XDRAM memory unit. The memory unit 200 comprises a chip 202 and XDRAMs 204. Commands are transmitted from the chip 202 to the XDRAMs 204 through a unidirectional bus 220. Serial data is transmitted from the chip 202 to the XDRAMs 204 through a bi-directional serial link 224. Data, however, is intercommunicated between the chip and the XDRAMs 204 through a bidirectional bus 222.

Specifically, components on the chip 202 communicate with one another and with the XDRAMs 204 in order for the memory to function. The chip 202 comprises a memory interface unit 206 and an XIO 208. The XIO 208 performs communication between the chip 202 and the XDRAMs 204, which include the commands, data, and serial data. The memory interface unit 206, however, transmits commands to the XIO 208 through a unidirectional bus 216, while data is transmitted between the XIO 208 and the memory interface unit 206 through two unidirectional buses 218.

The difference between the memory unit 200 and more conventional memory units lies in the memory interface unit. The memory control unit comprises address and holding control 210, an XIO controller 212, and dataflow pattern buffers 214. More particularly, buffers are utilized in calibrations for both reads and writes, but in the modified memory an entire class of buffers specifically designated for either reads or writes is eliminated. The memory interface unit 206 instead utilizes the store path for all phases of operation. In normal operation, the memory interface unit 206 has the data and addresses for 32 cache lines (each having 128 bytes) or a total of 4096 bytes.

In conventional memories, calibrations occur in three distinct phases. During the first phase, data loading occurs with two functions in mind. The first function being a loading of pattern data into the conventional memory interface unit (not shown). The second function is to have the memory control unit (not shown) send commands to XDRAMs, such as the XDRAMs 204, to serially load the XDRAMs, such as the XDRAMs 204, with data and then send writes to commit the data to memory. This calibration data can occupy some or all of the 32 cache lines.

During the second and third phase, receive and transmit calibrations are performed. Receive calibration is performed during the second phase where the memory control unit (not shown) sources the read commands and provides expected data to calibrate the XIO (not shown). Transmit calibrations occur during the third phase where the memory control unit (not shown) stores the data and then provides read commands with expected data.

In contrast, the modified memory 200 reorders the sequences. The memory control unit 206 reorders the sequence so that serially loaded data is loaded first so that the data is committed to the XDRAMs by single writes. The modified memory 206 sends the serial patterns to the XDRAMs 204 and uses the command buses 216 and 220 to commit the data to the cores of the XDRAMs 204. These commands are normal stores with an addressing width of the XDRAMs. Once all of the data has been stored in the XDRAMs, stores, containing addresses and pattern data, are loaded and kept in a waiting pattern in anticipation of a receive calibration. The store addresses and datum are contained by the address and holding control 210 and the dataflow pattern buffer 214, respectively.

Then, within the second phase, receive calibrations can occur. When the XIO 208 wants to perform a receive iteration, XIO controller 212 turns stores into reads with expects. Hence, each store becomes a read. The new reads will launch the expected data to the XIO 208 at the correct time. The process by the XIO controller 212 of changing stores into read and launching the new reads will continue for the 32 cache lines. Then, the XIO 208 will start the process again until the calibration is complete.

Once the receive calibration is complete, phase three can be initiated to perform transmit calibrations. The XIO 208 informs the XIO controller 212 to perform a transmit calibration sequence. The XIO controller 212 takes store addresses from the address control 210 and launches the store data from the dataflow pattern buffer 214. Once all of the pattern cache lines are stored, the XIO controller 212 informs the control 210 to send the address again and changes the store addresses into reads with expects. The data from the XDRAMs 204 is compared with the data from the dataflow pattern buffer 214. This is repeated as many times as necessary until the calibration is complete.

Figure 2B:
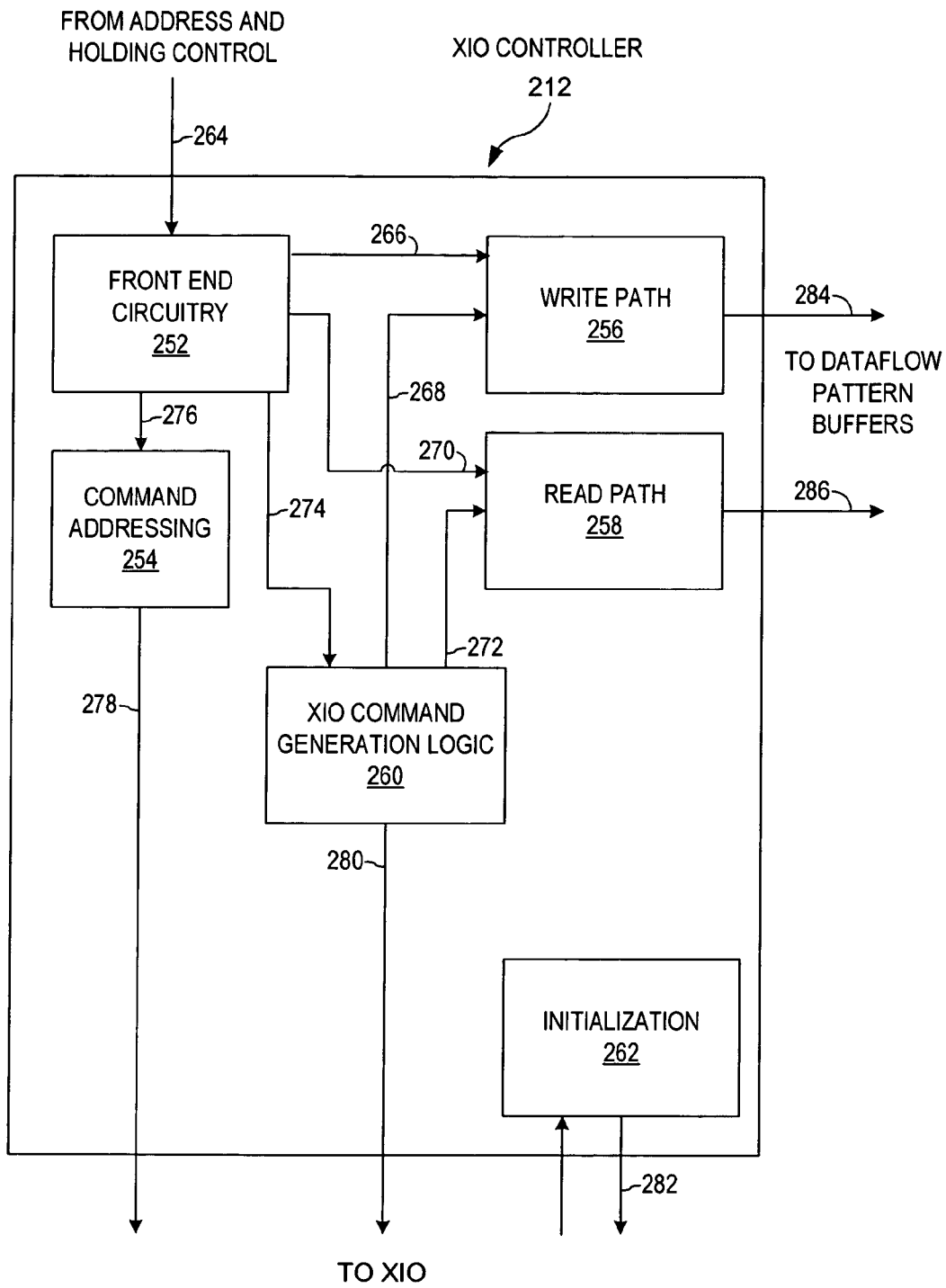
FIG. 2B is a block diagram depicting an XIO Controller of the modified XDRAM memory unit.

To perform the changes to the command from store to read, additional logic is employed. Referring to FIG. 2B of the drawings the reference numeral 212 generally designates the XIO controller. The XIO controller 212 comprises front end circuitry 252, command addressing logic 254, a write path 256, a read path 258, XIO command generation logic 260, and initialization logic 262.

Operation of the XIO controller is initiated with information provided to the front end circuitry 252. The front end circuitry 252 receives information from the address and holding control 210 of FIG. 2A through the communication channel 264. Then, the front end circuitry 252 can change write commands into read commands and provide control signals to other components. Specifically, the front end circuitry 252 provides control information to the write path 256, the read path 258, the command addressing logic 254, and the generation logic 260 through the communication channels 266, 270, 276, and 274, respectively.

Each of the remaining components of the XIO controller 212, then, can perform a specific function during normal operations. The command addressing logic provides information to the XIO 208 of FIG. 2A through the communication channel 278. The initialization logic 262 receives pattern enable and type signals and sends pattern marker signal to the XIO 208 of FIG. 2A through the communication channel 282. The write path 256 and the read path 258 provide store and read controls to the dataflow pattern buffer 214 of FIG. 2A through the communication channels 284 and 286. Additionally, the generation logic 260 provides control information to the write path 256 and the read path 258 through the communication channels 268 and 272, respectively.

In cases, however, where reads with expects are utilized, the remaining components have a slightly different functionality. The write path 256 starts a write-data-out of the dataflow pattern buffer 214 of FIG. 2A using timing parameters for expected data. The read path 258 stores away the information but does not use it functionally. The generation logic 260 is initially told to perform a read by the front end circuitry 252; however, a change signal from the front end circuitry 252 informs the generation logic 260 to initiate a write at the correct time for expected data.

Figure 3:
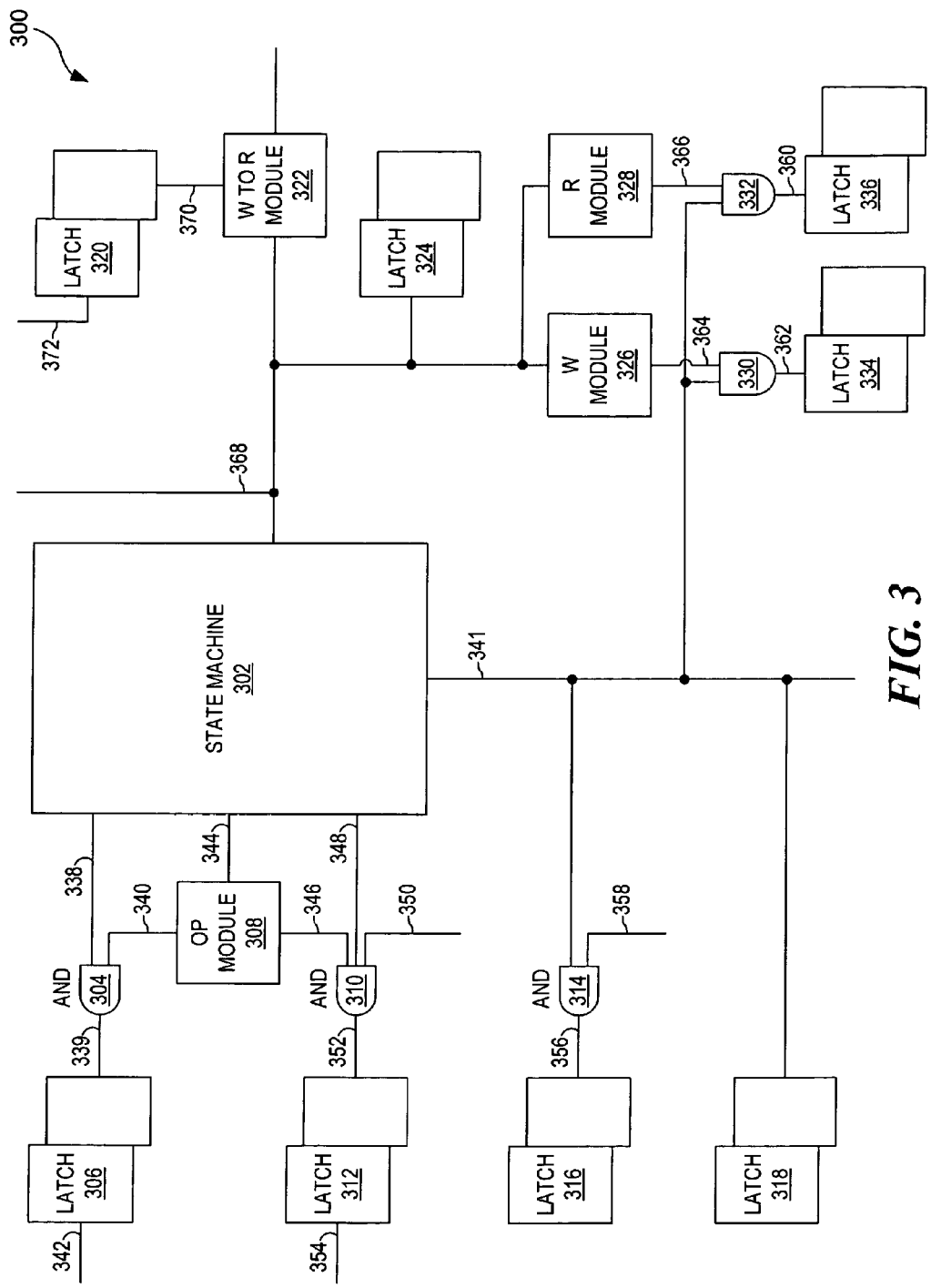
FIG. 3 is a block diagram depicting front end circuitry for switching writes to reads.

The functionality of the front end circuitry 252 then becomes significant in the operation of the XIO controller 212. Referring to FIG. 3 of the drawings, the reference numeral 300 generally designates front end circuitry for switching writes to reads. The circuitry 300 is contained within the XIO controller 212 of FIG. 2B and comprises a state machine 302, eight latches 306, 312, 316, 318, 320, 324, 334, and 336, five AND gates 304, 310, 314, 330, and 332, and four operation modules 308, 322, 326, and 328.

The state machine 302 is a main component within the logic 300 that assists generating the proper signal. The state machine 302 outputs a control signal to the operation module 308 through the communication channel 344. Based on the control signal, the operation module 308 can enable a read operation or a write operation. If the operation is a write operation, then a signal is output to the AND gate 304 through the communication channel 340. Additionally, a signal is output from the state machine 302 to the AND gate 304 through the communication channel 338. Once engaged, the AND gate 304 outputs a signal to the latch 306 through the communication channel 339. The latch 306 can then provide a Data Location Valid signal through the communication channel 342 to start write data operations. However, if the operation is a read with expects operation, then a signal is communicated from the operation module 308 to the AND gate 310 through the communication channel 346. The state machine 302 also transmits a signal to the AND gate 310 through the communication channel 348. A change-write-to-read signal is also communicated to the AND gate 310 through the communication channel 350. Based on the AND gate 310 inputs, the AND gate 310 can output a signal to the latch 312 through the communication channel 352. The latch 312, then, provides a Data Location Valid for Read with expects signal through the communication 354.

In addition to providing control for data location valid signals, the state machine 302 also relays taken commands. A command taken is output from the state machine 302 through the communication channel 341. The AND gate 314 receives the command taken signal in addition to another signal received through the communication channel 358. A latch 316 then receives the AND gate signal through the communication channel 356 to latch the command taken to inform the Address and Control 210 that the command has been taken. Bank sequencer latches 318 also receive the command taken signal to start an operation or series of operations.

In order for the state machine 302 to function, however, indications of commands are relayed to the state machine 302. The latch 320 receives control data for the type of operation from the Address control 210 of FIG. 2A through the communication channel 372. The latch 320, then, relays the control data to the operation module 322, which is a write-to-read module, through the communication channel 370. Based on the input signals, the operation module 322 output control signals to the state machine 302, bank sequencing latches 324, a command counter (not shown), and two operations modules 326 and 328 through the communication channel 368.

Based on the control signal from the operation module 322, write or read operations can be started. If the operation module 322 indicates read operations, then the read module 328 outputs a signal through the communication channel 366 to the AND gate 332. The AND gate 332 also receives a command taken signal from the communication channel 341. The AND gate 332 then can relay a signal to the latch 336, through communication channel 360, to provide read First-In-First-Out (FIFO) control.

On the other hand, if the operation module 322 indicates write operations, different logic is employed. Indications of write operations are transmitted to the write module 326 through the communication channel 368. Based on the indication, the write module 326 transmits a control signal to the AND gate 330 through the communication channel 364. The AND gate 330 also receives a command taken through the communication channel 341. A signal is then relayed from the AND gate 330 to the latch 334 through the communication channel 362. The latch 334 reflects a write start operation.

Figure 4:
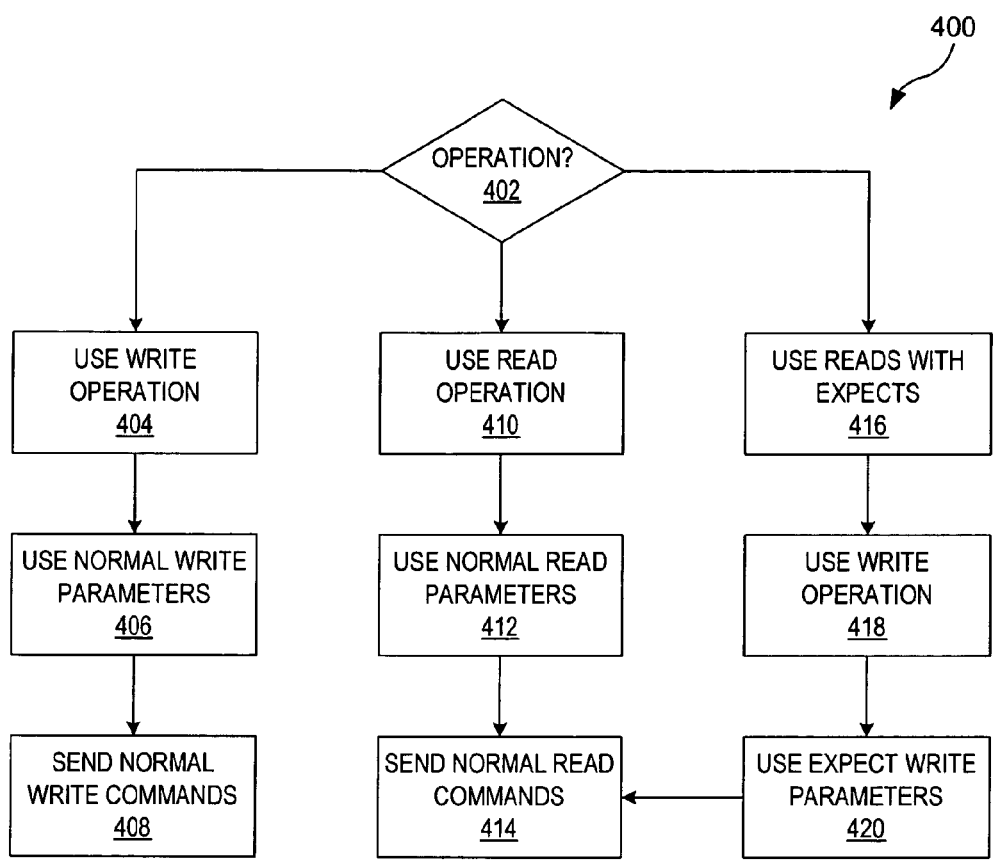
FIG. 4 is a flow chart depicting the operation the front end circuitry.

Referring to FIG. 4 of the drawings, the reference numeral 400 generally designates a simplified operation of the front end circuitry 300 of FIG. 3.

At the onset of operation, a determination is made as to the operation to be performed in step 402. Specifically, there are three types of operations that can be performed: write operations, read operations, and reads with expects. Each of the respective operations has a different procedure.

For write operations, specific components, paths, and procedures are employed. In step 404, write operations from the address holding control 210 of FIG. 2A are utilized. Normal write parameters are employed in step 406, and normal write commands are sent in step 408.

For read operations, other components, paths, and procedures are employed. In step 410, read operations from the address holding control 210 of FIG. 2A are utilized. Normal read parameters are employed in step 412, and normal read commands are sent in step 414.

For reads with expects, a combination of components, paths, and procedures from write and read operations are employed. In step 416, reads with expects from the address holding control 210 of FIG. 2A are utilized. In step 418, write operations from the address holding control 210 of FIG. 2A are utilized. Write with expects parameters are employed in step 420, and normal read commands are send in step 414.

Figure 5:
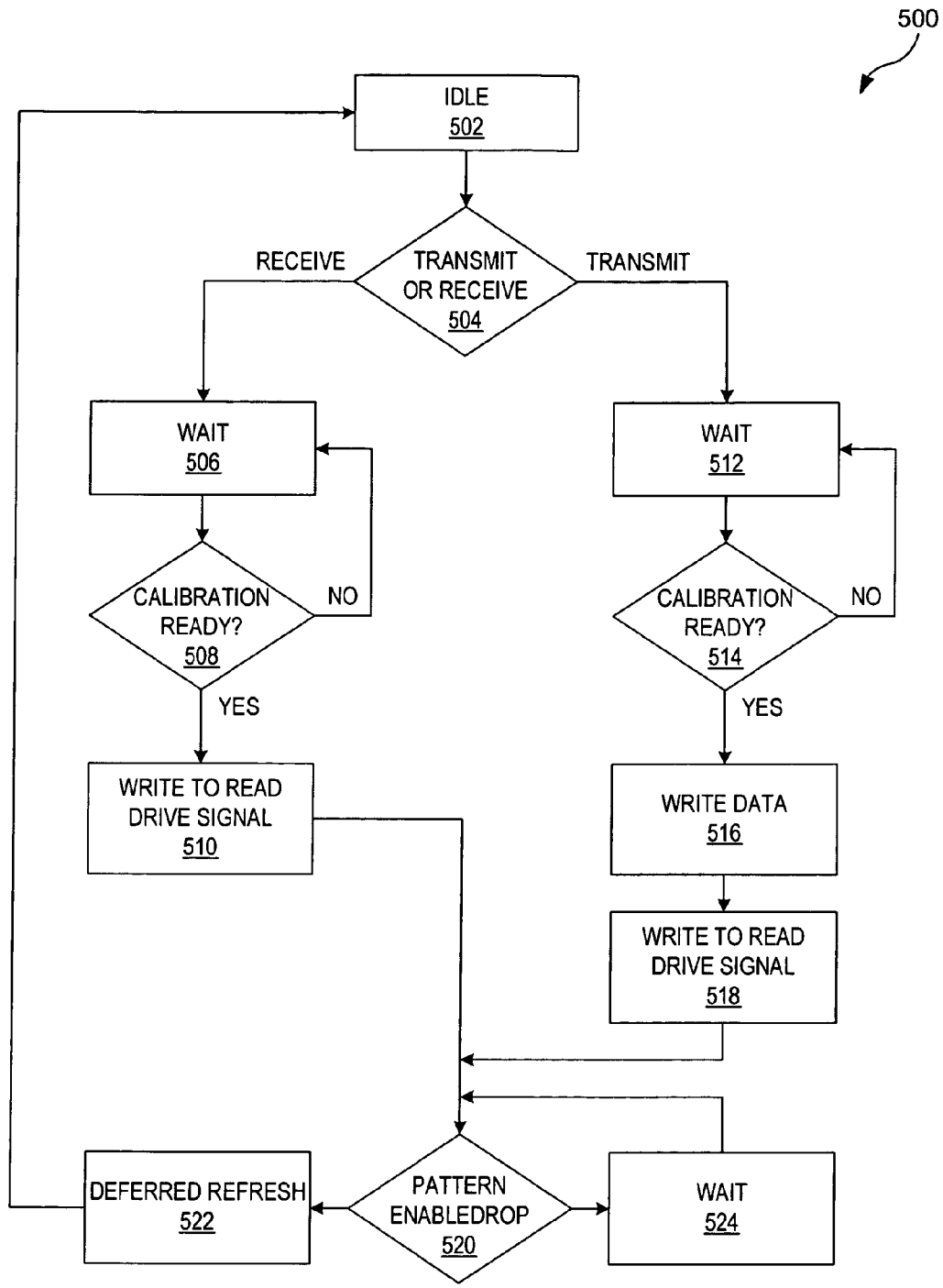
FIG. 5 is a flow chart depicting operations of the modified XDR™ Input/Output Unit (XIO).

Referring to FIG. 5 of the drawings, the reference numeral 500 generally designates the operation of the XIO controller 212 of FIG. 2. The XIO controller 212 begins in an idle state in step 502. A determination is then made as to whether a receive calibration or transmission calibration is to occur in step 504.

In the case of a receive calibration, the state machine 302 waits in steps for 506 and 508 for proper timing from the XIO 208 before proceeding. Once all timing parameters are met the store data is converted into read with expect data and sent to the XIO 208. Once ready, write-to-read signals are propagated in step 510, where data is read from the XDRAMs 204. The pattern enable signal in steps 520 and 524 transitions to logic low to indicate completion of the calibration loop. When the calibration is complete, deferred refreshes are performed in step 522, and the XIO controller 212 returns to idle in step 502.

When a transmit calibration is to be performed, no store data is converted. There is a wait period in step 512, so that all XDRAM parameters are met. Once the calibration is ready, in step 514, data is written to the XDRAMs 204 in step 516. Next, write-to-read signals are propagated in step 518, where data is read from the XDRAMs 204 and compared against data from dataflow pattern buffer 214. The pattern enable signal in steps 520 and 524 transitions to logic low to indicate completion of the calibration loop. When the calibration is complete, deferred refreshes are performed in step 522, and the XIO 212 returns to idle in step 502.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for effecting calibration of Random Access Memories (RAMs), comprising:
   storing a serial data pattern in a random access memory;
   establishing at least one store queue to store a calibration pattern, wherein the calibration pattern comprises a plurality of entries;
   receiving a calibration command to calibrate the random access memory;
   responsive to receiving the calibration command, determining whether the calibration command is either a receive calibration or a transmit calibration;
   responsive to receiving the calibration command that is the transmit calibration, converting the plurality of entries of the calibration pattern to a plurality of write commands and then to a plurality of read commands with expects;

calibrating the random access memory by comparing the serial data pattern to the calibration pattern; and responsive to receiving the calibration command that is the receive calibration, converting the plurality of entries of the calibration pattern to a plurality of read commands with expects, wherein converting the plurality of entries of the calibration pattern to the plurality of read commands with expects is performed by front end circuitry within a memory interface unit that is at least configured to convert the plurality of entries to the plurality of read commands with expects.

2. The method of claim 1, wherein converting the plurality of entries of the calibration pattern to the plurality of write commands and then to the plurality of read commands with expects is performed by the front end circuitry within the memory interface unit that is at least configured to convert the plurality of entries to the plurality of write commands and then to the plurality of read commands with expects.

3. A computer program product for effecting calibration of RAMs, the computer program product having a non-transitory medium with a computer program embodied thereon, the computer program comprising:

computer code for storing a serial data pattern in a random access memory;

computer code for establishing at least one store queue to store a calibration pattern, wherein the calibration pattern comprises a plurality of entries;

computer code for receiving a calibration command to calibrate the random access memory;

computer code for, responsive to receiving the calibration command, computer code for determining whether the calibration command is either a receive calibration or a transmit calibration;

responsive to receiving the calibration command that is the transmit calibration, computer code for converting the plurality of entries of the calibration pattern to a plurality of write commands and then to a plurality of read commands with expects; and computer code for calibrating the random access memory by comparing the serial data pattern to the calibration pattern; and responsive to receiving the calibration command that is the receive calibration, computer code for converting the plurality of entries of the calibration pattern to a plurality of read commands with expects, wherein the computer code for converting the plurality of entries of the calibration pattern to the plurality of read commands with expects is executed by front end circuitry within a memory interface unit that is at least configured to convert the plurality of entries to the plurality of read commands with expects.

4. The computer program product of claim 3, wherein the computer code for converting the plurality of entries of the calibration pattern to the plurality of write commands and then to the plurality of read commands with expects is executed by the front end circuitry within the memory interface unit that is at least configured to convert the plurality of entries to the plurality of write commands and then to the plurality of read commands with expects.

5. A processor for effecting calibration of Extreme RAMs, the processor including a computer program comprising:

computer code for storing a serial data pattern in a random access memory;

computer code for establishing at least one store queue to store a calibration pattern, wherein the calibration pattern comprises a plurality of entries;

computer code for receiving a calibration command to calibrate the random access memory; and computer code for responsive to receiving the calibration command, computer code for determining whether the calibration command is either a receive calibration or a transmit calibration;

responsive to receiving the calibration command that is the transmit calibration, computer code for converting the plurality of entries of the calibration pattern to a plurality of write commands and then to a plurality of read commands with expects; and computer code for calibrating the random access memory by comparing the serial data pattern to the calibration pattern; and responsive to receiving the calibration command that is the receive calibration, computer code for converting the plurality of entries of the calibration pattern to a plurality of read commands with expects, wherein the computer code for converting the plurality of entries of the calibration pattern to the plurality of read commands with expects is executed by front end circuitry within a memory interface unit that is at least configured to convert the plurality of entries to the plurality of read commands with expects.

6. The processor of claim 5, wherein the computer code for converting the plurality of entries of the calibration pattern to the plurality of write commands and then to the plurality of read commands with expects is executed by the front end circuitry within the memory interface unit that is at least configured to convert the plurality of entries to the plurality of write commands and then to the plurality of read commands with expects.

* * * * *